US008742538B2

(12) United States Patent
 Qian (10) Patent No.: US 8,742,538 B2
(45) Date of Patent: Jun. 3, 2014

(54) SIGE HBT AND MANUFACTURING METHOD THEREOF

(71) Applicant: Shanghai Hua Hong NEC Electronics Co., Ltd., Shanghai (CN)

(72) Inventor: Wensheng Qian, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/671,595

(22) Filed: Nov. 8, 2012

(65) Prior Publication Data

US 2013/0113022 A1     May 9, 2013

(30) Foreign Application Priority Data

Nov. 8, 2011    (CN) .......................... 2011 1 0349921

(51) Int. Cl.
     *H01L 21/70*      (2006.01)
     *H01L 29/66*      (2006.01)
(52) U.S. Cl.
     USPC .................... 257/526; 257/197; 257/E29.188
(58) Field of Classification Search
     USPC ................................. 257/197, 526, E29.188
     See application file for complete search history.

(56) References Cited

U.S. PATENT DOCUMENTS

| 2007/0085167 | A1* | 4/2007 | Saitoh et al. | 257/565 |
|---|---|---|---|---|
| 2008/0211064 | A1* | 9/2008 | Orner et al. | 257/622 |
| 2008/0237706 | A1* | 10/2008 | Williams et al. | 257/343 |
| 2008/0237783 | A1* | 10/2008 | Williams et al. | 257/513 |
| 2009/0146258 | A1* | 6/2009 | Zhang et al. | 257/592 |
| 2011/0073944 | A1* | 3/2011 | Tsukihara | 257/337 |
| 2012/0098095 | A1* | 4/2012 | Lin et al. | 257/565 |
| 2013/0119433 | A1* | 5/2013 | Wang | 257/146 |

\* cited by examiner

*Primary Examiner* — Victor A Mandala
(74) *Attorney, Agent, or Firm* — MKG, LLC (57) ABSTRACT

A silicon-germanium (SiGe) heterojunction bipolar transistor (HBT) is disclosed, which includes: two isolation structures each being formed in a trench; a set of three or more pseudo buried layers formed under each trench with every adjacent two pseudo buried layers of the set being vertically contacted with each other; and a collector region. In this design, the lowermost pseudo buried layers of the two sets are laterally in contact with each other, and the collector region is surrounded by the two isolation structures and the two sets of pseudo buried layers. As the breakdown voltage of a SiGe HBT according to the present invention is determined by the distance between an uppermost pseudo buried layer and the edge of an active region, SiGe HBTs having different breakdown voltages can be achieved. A manufacturing method of the SiGe HBT is also disclosed.

5 Claims, 5 Drawing Sheets

SIGE HBT AND MANUFACTURING METHOD THEREOF

CROSS-REFERENCES TO RELATED APPLICATIONS

This application claims the priority of Chinese patent application number 201110349921.5, filed on Nov. 8, 2011, the entire contents of which are incorporated herein by reference.

TECHNICAL FIELD

The present invention relates to a heterojunction bipolar transistor (HBT), and more particularly, to a silicon-germanium (SiGe) HBT and a manufacturing method thereof.

BACKGROUND

In the design of radio frequency (RF) chips, in order to obtain desired chip functions, it is needed sometimes to integrate silicon-germanium (SiGe) heterojunction bipolar transistors (HBTs) having different operating voltages or different characteristic frequencies (namely, cutoff frequency) into one chip. For example, on an RF transceiver chip, a power amplifier needs a high-breakdown voltage SiGe HBT to satisfy the demand for a high-power output, while a low-noise amplifier needs a standard or high-speed SiGe HBT to provide a low noise factor.

Currently adopted practice for addressing the issue of integrating SiGe HBTs having different operating voltages into one chip is to form collector regions having different doping concentrations during the manufacture of the chip, so as to achieve SiGe HBTs with different breakdown voltages, and hence provide different operating voltages. Moreover, this practice is also adopted to achieve SiGe HBTs with different characteristic frequencies by forming collector regions having different doping concentrations.

This practice requires different lithographic masks for the SiGe HBTs having different breakdown voltages to perform different ion implantation processes so as to obtain different doping concentrations in the collector regions. In the above practice, how many different operating voltages the SiGe HBTs have, how many times the lithographic process and ion-implantation process are performed, thus leading to an increased complexity in manufacturing process and a high cost.

SUMMARY OF THE INVENTION

An objective of the present invention is to provide a silicon-germanium (SiGe) heterojunction bipolar transistor (HBT) of which the breakdown voltage can be adjusted by altering its layout rather than its doping concentration. To this end, the present invention is also to provide a manufacturing method of the SiGe HBT.

To achieve the above objective, the present invention provides a SiGe HBT, including: a substrate; two trenches formed in the substrate, each having an isolation structure formed therein; two sets of pseudo buried layers, each set being formed in the substrate under a corresponding trench, each set including three or more pseudo buried layers with every adjacent two pseudo buried layers vertically contacting with each other, the lowermost pseudo buried layers of the two sets laterally contacting with each other, the uppermost pseudo buried layer of each set being in contact with its corresponding trench; and a collector region, surrounded by the isolation structures in the two trenches and the two sets of pseudo buried layers.

Preferably, except for the lowermost pseudo buried layers, each of the other pseudo buried layers in a set is not laterally connected to its corresponding pseudo buried layer in the other set.

In order for the sets of the three or more pseudo buried layers under the trenches to be formed conveniently, the cross section of each trench is preferred to have a regular trapezoidal shape, which is narrow at top and wide at bottom.

To achieve the above objective, the present invention also provides a method of manufacturing SiGe HBT, which includes:

forming two trenches in a substrate;

forming two sets of pseudo buried layers, each set being formed in the substrate under a corresponding trench, each set including three or more pseudo buried layers with every adjacent two pseudo buried layers vertically contacting with each other, the lowermost pseudo buried layers of the two sets laterally contacting with each other, the uppermost pseudo buried layer of each set being in contact with its corresponding trench; and forming an isolation structure in each of the trenches and a collector region being surrounded by the isolation structures in the two trenches and the two sets of pseudo buried layers.

Preferably, the three or more pseudo buried layers of each set are formed in the order that the lowermost layer is formed at first and each of the other layers is formed later than a layer thereunder.

In an embodiment, the method further includes forming inner sidewalls in each trench prior to forming an isolation structure in each trench.

In an embodiment, the method further includes:

depositing a first dielectric layer on a surface of the substrate and etching it to form a base window therein, and forming a doped SiGe single crystal silicon layer in the base window and on the first dielectric layer and removing a portion of the deposited SiGe single crystal silicon layer and a portion of the first dielectric layer, such that a remaining part of the SiGe single crystal silicon layer and remaining parts of the first dielectric layer cover the collector region only;

depositing a second dielectric layer and forming an emitter window therein by etch; forming a polysilicon layer and removing a portion of the polysilicon layer and a portion of the second dielectric layer, such that a remaining part of the polysilicon layer and remaining parts of the second dielectric layer cover the base window only;

forming sidewalls on both sides of the remaining part of the polysilicon layer and the remaining parts of the second dielectric layer, and forming sidewalls on both sides of the remaining part of the SiGe single crystal silicon layer and the remaining parts of the first dielectric layer; and depositing a third dielectric layer and polishing it; etching the third dielectric layer to form a first hole which is in contact with the remaining part of the polysilicon layer, second holes which are in contact with the remaining part of the SiGe single crystal silicon layer, and third holes which are in contact with the uppermost pseudo buried layers; and filling these holes with a metal.

Instead of forming one buried layer under each side of the collector region that is adopted in the prior art, the SiGe HBT of the present invention forms two sets of pseudo buried layers with each set being formed in the substrate under a corresponding trench and including three or more pseudo buried layers, and forms deep holes (namely, the third holes) through the isolation structures in the trenches to connect with the uppermost pseudo buried layers. With such new design, the breakdown voltage and characteristic frequency of the SiGe HBT can be adjusted by changing the distance between an uppermost pseudo buried layer and an active region (namely, the distance between an uppermost pseudo buried layer and a recessed portion that is formed around the middle part of the collector region, or the distance between an uppermost pseudo buried layer and a bottom corner of a trench that is nearer to the center of the device), and thereby SiGe HBTs with different breakdown voltages can be achieved to meet the requirements of chip design.

Moreover, in the manufacturing method of the SiGe HBT of the present invention, three or more pseudo buried layers are formed by multiple times of ion implantation with different energies, among which the lowermost pseudo buried layers are laterally connected and both of them are located under the collector region to provide a heavily doped collector pickup terminal to form ohmic contact with the deep hole electrodes. Such deign does not need additional lithographic processes or masks and thus can result in process simplification and cost reduction.

DETAILED DESCRIPTION

Figure 1:
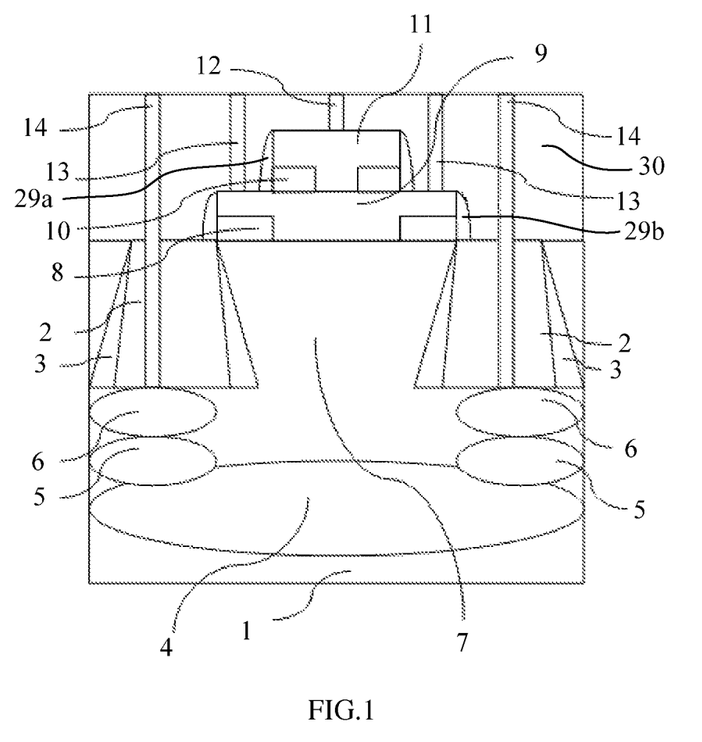
FIG. 1 is a schematic illustration of the structure of a SiGe HBT according to the present invention.

Referring to FIG. 1 which illustrates a silicon-germanium (SiGe) heterojunction bipolar transistor (HBT) constructed according to an embodiment of the present invention. The SiGe HBT has a structure as follows: trenches 2 are formed in a substrate 1 and a dielectric material is filled in each trench 2 to form an isolation structure therein; inner sidewalls 3 are formed over inner side faces of each trench 2; from the bottom of each trench 2 downward, a third pseudo buried layer 6, a second pseudo buried layer 5 and a first pseudo buried layer 4 are formed in this order, with every pseudo buried layer being vertically in contact with the pseudo buried layer under it; the two first pseudo buried layers 4 under respective trenches 2 are laterally connected and thereby integrated into one; a collector region 7 is formed in the region surrounded by the two trenches 2, two third pseudo buried layers 6, two second pseudo buried layers 5 and the two first pseudo buried layers 4; two first dielectric portions 8 and a T-shaped SiGe base region 9 are formed above the collector region 7, and the first dielectric portions 8 are located under respective two extending portions of the T-shaped SiGe base region 9; on each outer side of the first dielectric portions 8 and the T-shaped SiGe base region 9, a sidewall 29b is formed above the isolation structure, covering the corresponding side face of the body; two second dielectric portions 10 and a T-shaped polysilicon emitter region 11 are formed on the SiGe base region 9, and the second dielectric portions 10 are located under respective two extending portions of the T-shaped emitter region 11; on each outer side of the second dielectric portions 10 and the T-shaped emitter region 11, a sidewall 29a is formed above the isolation structure, covering the corresponding side face of the body; a third dielectric layer (also referred to as an interlayer dielectric) 30 is formed on the surface of the substrate, and a first hole 12, second holes 13 and third holes 14 are formed therein, each being filled with a metal electrode; the emitter region 11 is in contact with the electrode within the first hole 12; the SiGe base region 9 is in contact with the electrodes within the second holes 13; and each of the third pseudo buried layers 6 is in contact with the electrode within a third hole 14.

It should be appreciated that the present invention is not limited to a set of three pseudo buried layers formed under each trench in this embodiment, and it is also applicable to form more than three pseudo buried layers under each trench, with every adjacent two pseudo buried layers vertically contacting with each other. Among the more than three pseudo buried layers in a set, the lowermost pseudo buried layer is laterally contacting with the lowermost pseudo buried layer of the other set, and none of the other pseudo buried layers except for the lowermost one in a set is laterally connected to its corresponding pseudo buried layer in the other set.

The SiGe HBT of the present invention has characteristics as follows:

Firstly, two sets of pseudo buried layers are formed under each trench, each set including three or more pseudo buried layers with every adjacent two pseudo buried layers vertically contacting with each other, the lowermost pseudo buried layers of the two sets laterally contacting with each other, the uppermost pseudo buried layer of each set being in contact with its corresponding trench.

Among these pseudo buried layers, the uppermost ones are in contact with the isolation structures in the trenches 2 and are formed by an ion implantation process with a low energy. The uppermost pseudo buried layers are used to form ohmic contact with the deep contact holes (namely, the third holes 14). Each of the uppermost pseudo buried layers is closely adjacent to the bottom of the corresponding trench 2 with no gap between them. As shown in FIG. 1, on each side of the device, the distance between the inner side of the uppermost pseudo buried layer 6, namely, the side nearer to the center of the device, and the recessed portion formed around the middle part of the collector region 7 (namely, the distance between the inner side of the uppermost pseudo buried layer 6 and one of the corresponding trench's bottom corners that is nearer to the center of the device), which is also the distance between the uppermost pseudo buried layer and the active region, is defined as x. When x is reduced, the characteristic frequency of the device will increase and the breakdown voltage of the device will decrease, and vice versa.

The first pseudo buried layers 4 are lowest located which are laterally connected to each other and thereby integrated into one. The first pseudo buried layers 4 are formed by an ion implantation process with a high energy which leads to the lateral diffusion of the implanted impurities. The laterally connected lowermost pseudo buried layers form a buried layer located under an active region and being far from the surface of the device. This structure contributes to reducing the series resistance of the collector region and to lowering the saturation voltage drop of the SiGe HBT device.

The pseudo buried layers vertically located between the uppermost and lowermost ones are formed by ion implantation processes with medium energies and are used to connect the uppermost and lowermost pseudo buried layers.

Secondly, in order for the convenience in conducting ion implantation processes to form three or more pseudo buried layers, the cross section of each trench is preferred to have a regular trapezoidal shape, which is narrow at top and wide at bottom. A regular-trapezoidal-shaped cross section of the trenches facilitates the subsequent formation of pseudo buried layers by preventing ions from penetrating into inner side faces of the trenches 2 during ion-implantation processes. Moreover, it allows high-energy ion implantation which can make implanted ions laterally diffuse to make different pseudo buried layers be mutually connected and therefore jointly achieve the function of a buried layer, thus avoiding the increase of the device's saturation voltage drop caused by lateral distance increase.

More preferably, each trench has a cross section shape of isosceles trapezoid.

The cross section of the collector region 7 has an inverted T-shape, i.e., the collector region has a width at its bottom greater than that at its top. Moreover, the collector region 7 has a recessed portion around its middle part on each side and has a relatively low doping concentration.

Thirdly, compared to the first hole 12 and second holes 13 which are formed through the interlayer dielectric 30 and are connected to the emitter region 11 and the SiGe base region 9, respectively, the third holes 14 are formed both through the interlayer dielectric 30 and the isolation structures in the trenches 2 and are connected to the uppermost pseudo buried layers.

In this embodiment, the present invention is able to achieve different breakdown voltages for the SiGe HBT by adjusting the distance x between the third pseudo buried layer 6 and the active region. Further, a greater distance x will lead to a higher breakdown voltage and a lower characteristic frequency, and vice versa.

The present invention provides SiGe HBTs having different breakdown voltages by layout alteration. The first pseudo buried layers contain an impurity that can laterally diffuse easily, such as phosphorus (for NPN type) or boron (for PNP type), so as to achieve better diffusion of the impurities in the first pseudo buried layers to form a collector buried layer. On the other hand, the distance x between an uppermost pseudo buried layer and the active region is an important factor for altering properties of the device. A SiGe HBT having a desired breakdown voltage or characteristic frequency can be conveniently obtained just by adjusting the distance between an uppermost pseudo buried layer and the active region without the involvement of additional processes.

The SiGe HBT manufacturing method in accordance with the present invention includes the following steps 1 to 6.

Figure 2A:
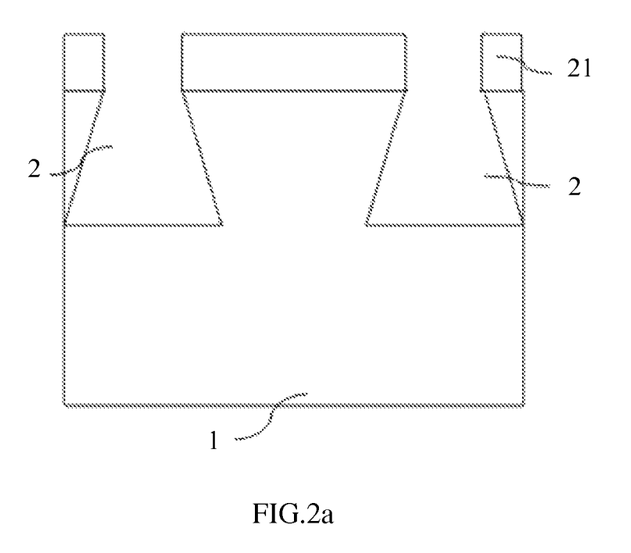
FIGS. 2a to 2e schematically illustrate structures in various steps of a manufacturing method of the SiGe HBT according to the present invention.

Step 1: as shown in FIG. 2a, a semiconductor substrate (generally, a silicon substrate) 1 is etched to form trenches 2 therein by using, for example, a shallow trench isolation (STI) process.

Optionally, a hard mask layer 21 is deposited before forming the trenches. The hard mask layer 21 may be formed of a dielectric material consisted of, for example, one or more selected from the group consisting of $SiO_2$, $Si_3N_4$ and $SiO_xN_y$ (where x and y are both natural numbers). Its thickness depends on the energy of ion implantation processes for forming the pseudo buried layers. In other words, the hard mask layer 21 should be thick enough to completely block the ions implanted during the process of forming the pseudo buried layers. After depositing the hard mask layer 21, the trenches 2 are formed in the substrate 1 by using lithographic and etching processes.

Preferably, the cross section of each trench 2 has a regular trapezoidal shape, i.e., which is narrow at top and wide at bottom.

More preferably, the cross section of each trench 2 has an isosceles trapezoidal shape.

Figure 2B:
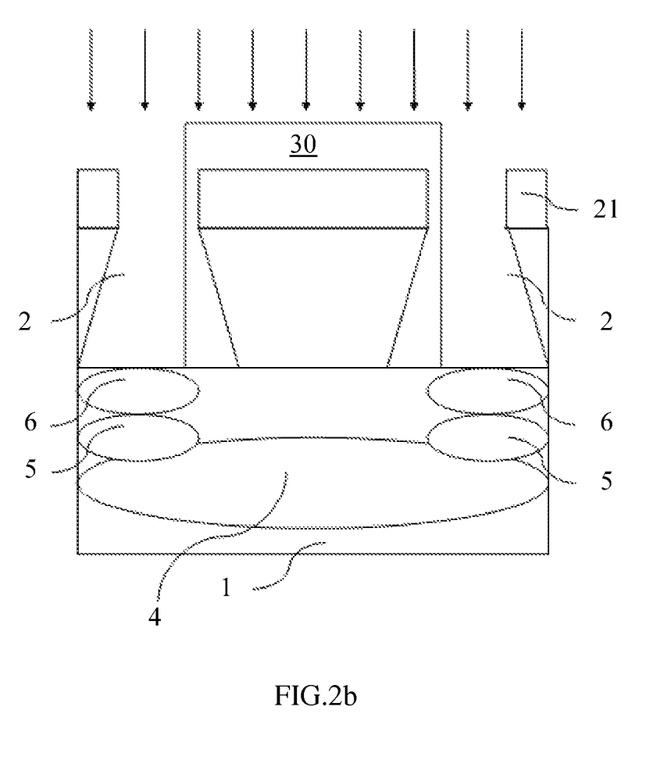

Step 2: referring to FIG. 2b, under the bottom of each trench 2, a first pseudo buried layer 4, a second pseudo buried layer 5 and a third pseudo buried layer 6 are formed by using ion implantation processes utilizing different energies, with every two adjacent pseudo buried layers being vertically in contact with each other and the two first pseudo buried layers 4 being laterally connected to each other;

Optionally, a portion of the bottom region of each trench 2 is coated with a photoresist 30 in advance by using a lithographic process. After that, multiple ion implantation processes with different implantation energies are performed on the portion of the bottom region of each trench 2 that is not covered by the photoresist 30. In these processes, the implantation energy determines the range of implanted ions, namely, the total distance traveled by the ions within the substrate. In order to form three or more pseudo buried layers under the bottom of each trench 2, which has different distances from the bottom of the trench, at least three ion implantation processes with different implantation energies should be adopted in this step.

Preferably, the ion implantation processes are performed in the following steps and under conditions as follows.

At first, a high-energy ion implantation process and thereafter an annealing process are carried out. As a high energy (greater than 500 KeV) is applied, the ion implanted regions formed are located farthest from the bottom of the respective trenches 2. After the annealing process is conducted, the two ion implanted regions formed are laterally connected to each other due to lateral diffusion of the ions, and thereby form the first pseudo buried layers 4 in the substrate 1. Preferably, a medium implantation dose ranging from $1 \times 10^{12}$ atoms (or ions)/$cm^2$ to $1 \times 10^{14}$ atoms (or ions)/$cm^2$ is adopted in this step.

Next, a medium-energy ion implantation process and thereafter optionally an annealing process are carried out. As a medium energy (from 50 KeV to 500 KeV) is applied, the ion implanted regions formed are neither farthest from nor nearest to the bottom of the respective trenches 2. The ion implanted regions formed above the first pseudo buried layers 4 form two second pseudo buried layers 5 for connecting the lowermost pseudo buried layers 4 and the uppermost pseudo buried layers 6. The implantation dose for this step is $1 \times 10^{14}$ atoms (or ions)/$cm^2$ to $1 \times 10^{16}$ atoms (or ions)/$cm^2$. When more than three pseudo buried layers are to be formed, this medium-energy ion implantation process will be carried out for multiple times to form more than one pseudo buried layer between the uppermost and lowermost pseudo buried layers under each trench.

At last, a low-energy ion implantation process and thereafter optionally an annealing process are carried out. As a low energy (less than 50 KeV) is applied, the ion implanted regions formed are nearest to and closely adjacent to the bottom of the respective trenches 2. The ion implanted regions formed above the two second pseudo buried layers 5 form two third pseudo buried layers 6 that form ohmic contact with deep hole electrodes. Preferably, a high implantation dose ranging from $1 \times 10^{14}$ atoms (or ions)/$cm^2$ to $1 \times 10^{16}$ atoms (or ions)/$cm^2$ is adopted in this step.

For a PNP type SiGe HBT, all the three pseudo buried layers are P-type doped with a P-type impurity which is preferred to be boron.

For an NPN type SiGe HBT, all the three pseudo buried layers are N-type doped with an N-type impurity which is preferred to be phosphorus, arsenic, antimony or others. Preferably, the N-type impurity implanted into the first pseudo buried layers 4 and second pseudo buried layers 5 is phosphorus or arsenic; and the N-type impurity implanted into the third pseudo buried layers 6 is phosphorus.

Figure 2C:
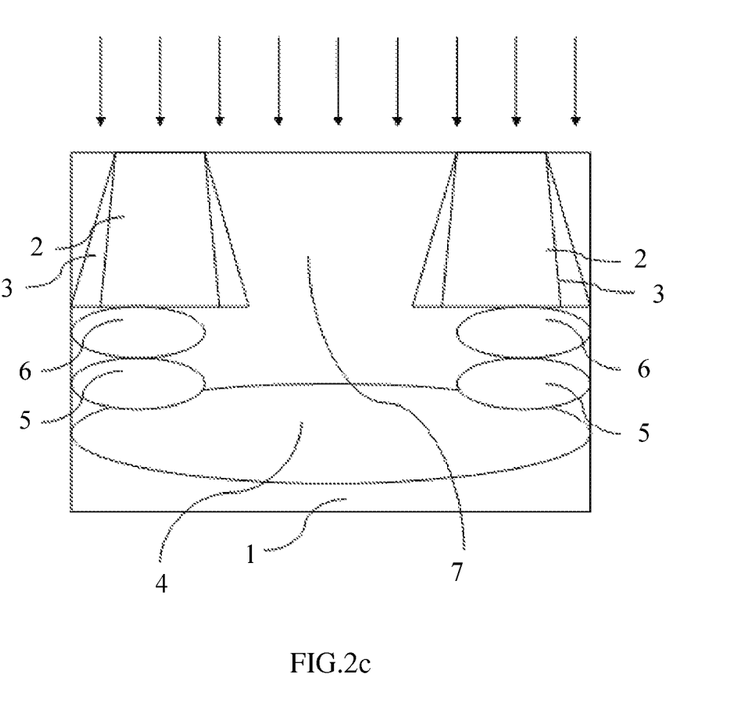

Step 3: as shown in FIG. 2c, a dielectric material is filled into the trenches 2 to form isolation structures therein, and an ion implantation process is performed to the portion of the substrate 1 between the two trenches 2 to form a collector region 7.

For example, inner sidewalls 3 may be formed in the trenches 2 first, and then the dielectric material is filled in to form the isolation structures. When the inner sidewalls are to be formed, if there is still photoresist 30 coated on the substrate, it should be removed first.

The inner sidewalls 3 are formed by an existing process, simply described as follows. First, a silicon oxide layer is optionally grown over inner side faces and bottoms of the trenches 2 as a pad oxide layer by using a thermal oxidation method. Next, a silicon oxide layer is deposited into the trenches 2 (or over the whole surface of the substrate), such that the layer covers the inner side faces and bottoms of the trenches 2. After that, a dry etching process is carried out to the deposited silicon oxide layer until silicon under the bottoms of the trenches 2 or the hard mask layer 21 on the substrate 1 is reached. After the etching process is completed, the inner sidewalls 3 are formed over inner side faces of each trench 2.

An existing process, such as an STI process, is used to fill the trenches 2, which is simply described as follows. First, a dielectric layer such as silicon oxide is deposited into the trenches 2 (or over the whole surface of the substrate), such that the layer of the dielectric material completely fills the trenches 2 and covers the hard mask layer 21. After that, the deposited dielectric layer is planarized by polishing it with a chemical mechanical polishing (CMP) process while taking the hard mask layer 21 as a polish-stop layer, such that the isolation structures are formed in the trenches 2.

The collector region 7 is formed by using, for example, a lightly doped drain (LDD) process with an implantation dose of less than $1 \times 10^{13}$ atoms (or ions)/cm$^2$.

Figure 2D:
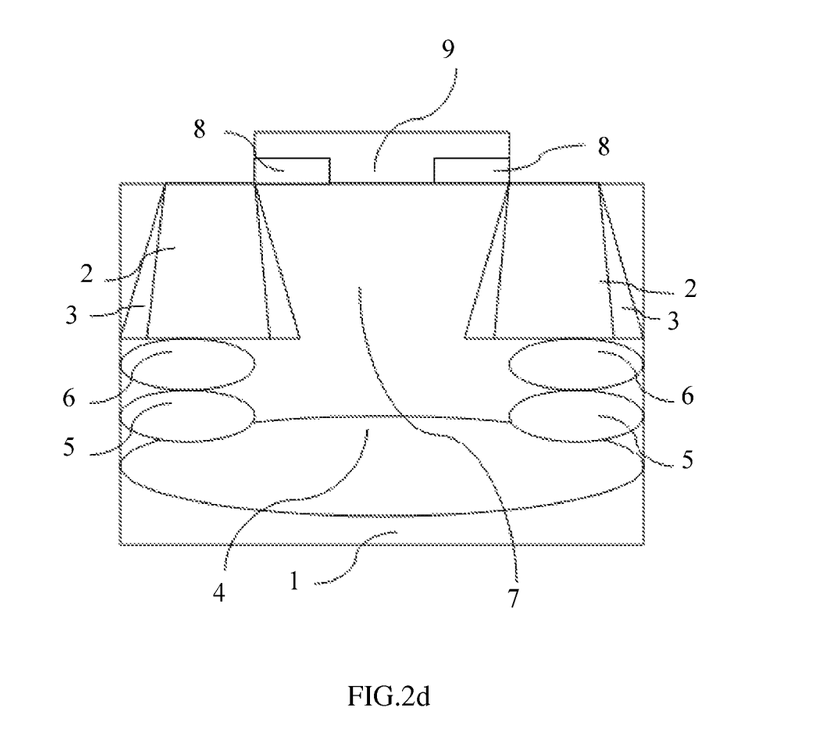

Step 4: as shown in FIG. 2d, a first dielectric layer 8 is deposited on the surface of the substrate and a base window is formed therein by using an etching process; then a SiGe single crystal silicon layer 9 is deposited on the surface of the substrate; and thereafter the layers of the SiGe single crystal silicon 9 and the first dielectric material 8 are etched so as to only retain their portions located above the collector region 7.

The first dielectric layer 8 is, for example, silicon oxide. The base window is the area shown in FIG. 1, where a base region 9 and the collector region 7 contact with each other. After the etching process is completed, a SiGe single crystal silicon portion 9 (namely the SiGe base region) having a T-shaped cross section, and two first dielectric portions 8 located under respective two extending portions of the T-shaped SiGe single crystal silicon portion 9 are formed.

Figure 2E:
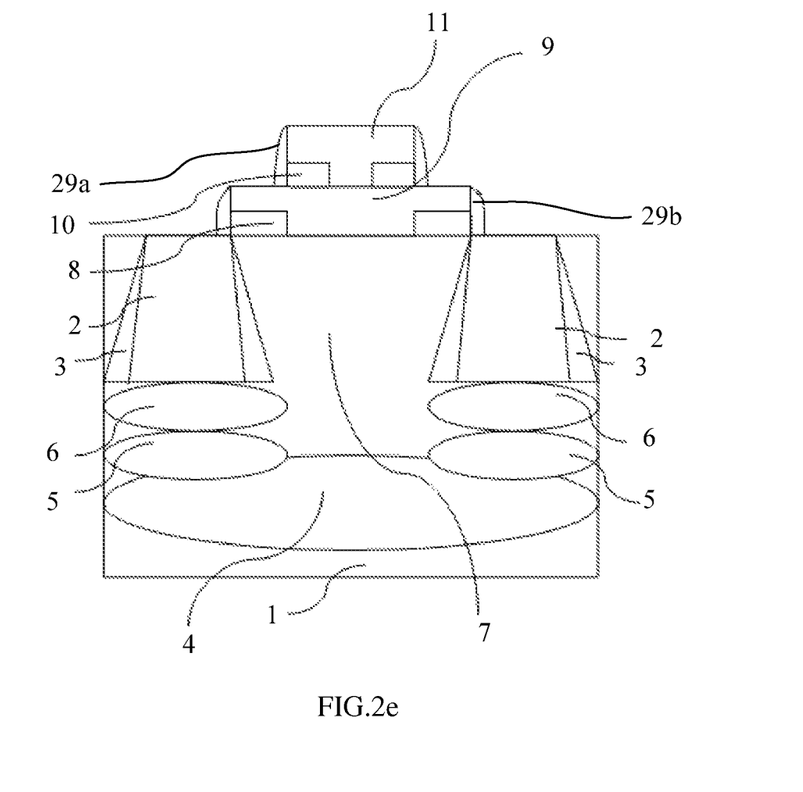

Step 5: as shown in FIG. 2e, a second dielectric layer 10 is deposited on the surface of the substrate and an emitter window is formed therein by using an etching process; then a polysilicon layer 11 is deposited on the surface of the substrate; after that, the layers of the polysilicon 11 and the second dielectric layer 10 are etched so as to only retain their portions located above the area of the base window; and at last, sidewalls 29a and 29b are formed.

The second dielectric layer 10 is, for example, silicon oxide. The emitter window is the area shown in FIG. 1, where an emitter region 11 and the base region 9 contact with each other. After the etching process is completed, the emitter region 11 which has a T-shaped cross section, and two second dielectric portions 10 located under respective two extending portions of the T-shaped emitter region 11 are formed. The finish point of the etching process is set, for example, at the upper surface of the SiGe base region 9.

Sidewalls 29a are formed on the SiGe base region 9 each covering a side face of the emitter region 11 and the second dielectric portions 10; and sidewalls 29b are also formed each covering a side face of the SiGe base region 9 and the first dielectric portions 8.

The sidewalls 29a and 29b are formed by using existing processes, simply described as follows. First, a dielectric layer, such as silicon oxide or silicon nitride, is deposited onto the surface of the substrate. Next, a dry etch-back process is carried out to the deposited dielectric layer until the SiGe base region 9 or the upper surface of the isolation structure within a trench 2 is reached. After the etch-back process is completed, the sidewalls 29a are formed on both sides of the emitter region 11 and the second dielectric portions 10 and the sidewalls 29b are formed on both sides of the SiGe base region 9 and the first dielectric portions 8.

Step 6: as shown in FIG. 1, a third dielectric layer 30 is deposited onto the surface of the substrate and is thereafter polished; after that, holes are formed in the third dielectric layer 30 by using etching processes, including a first hole 12 contacting with the emitter region 11, second holes 13 contacting with the SiGe base region 9, and third holes 14 contacting with the third pseudo buried layers 6; and at last, these holes are filled with a metal.

The third dielectric layer 30 is also referred to as an interlayer dielectric (ILD), which is formed of, for example, one or more selected from the group consisting of silicon oxide, silicon nitride and silicon oxynitride. The surface of the third dielectric layer 30 is polished and planarized by using a CMP process or other planarization processes. The metal is filled into the holes by using, for example, a tungsten plug process. The emitter region 11 is picked up by the electrode within the first hole 12; the base region 9 is picked up by the electrodes within the second holes 13; and the collector region 7 is picked up jointly by the first pseudo buried layers 4, the second pseudo buried layers 5, the third pseudo buried layers 6 and the electrodes within the third holes 14.

While preferred embodiments have been presented in the foregoing description, they are not intended to limit the invention in any way. Those skilled in the art can make various modifications and variations without departing from the spirit or scope of the invention. Thus, it is intended that the present invention embraces all such alternatives, modifications and variations.

What is claimed is:

1. A silicon-germanium (SiGe) heterojunction bipolar transistor (HBT), comprising:
    a substrate;
    two trenches formed in the substrate, each having an isolation structure formed therein;
    two sets of pseudo buried layers, each set being formed in the substrate under a corresponding trench, each set comprising three or more pseudo buried layers with every adjacent two pseudo buried layers vertically contacting with each other, the lowermost pseudo buried layers of the two sets laterally contacting with each other, the uppermost pseudo buried layer of each set being in contact with its corresponding trench; and
    a collector region, surrounded by the isolation structures in the two trenches and the two sets of pseudo buried layers.

2. The SiGe HBT according to claim 1, wherein except for the lowermost pseudo buried layer, each of the other pseudo buried layers in a set is not laterally connected to its corresponding pseudo buried layer in the other set.

3. The SiGe HBT according to claim 1, wherein each trench has a cross section shape of trapezoid, which is narrow at top and wide at bottom.

4. The SiGe HBT according to claim 1, wherein the collector region has a cross section shape of an inverted "T", which is narrow at top and wide at bottom with recessed portions around its middle part on both sides.

5. The SiGe HBT according to claim 4, wherein on each side of the collector region, a distance between the uppermost pseudo buried layer and the recessed portion is adjustable.

* * * * *